United States Patent
Takata

(10) Patent No.: US 12,376,389 B2
(45) Date of Patent: Jul. 29, 2025

(54) IMAGING ELEMENT AND IMAGING DEVICE

(71) Applicant: SONY SEMICONDUCTOR SOLUTIONS CORPORATION, Kanagawa (JP)

(72) Inventor: Daizo Takata, Kumamoto (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 582 days.

(21) Appl. No.: 17/755,549

(22) PCT Filed: Jul. 29, 2020

(86) PCT No.: PCT/JP2020/028952
§ 371 (c)(1),
(2) Date: May 2, 2022

(87) PCT Pub. No.: WO2021/090545
PCT Pub. Date: May 14, 2021

(65) Prior Publication Data
US 2022/0384515 A1    Dec. 1, 2022

(30) Foreign Application Priority Data

Nov. 8, 2019   (JP) ................................. 2019-203127

(51) Int. Cl.
*H01L 27/146*    (2006.01)
*H10F 39/00*     (2025.01)

(52) U.S. Cl.
CPC ......... *H10F 39/016* (2025.01); *H10F 39/024* (2025.01); *H10F 39/811* (2025.01)

(58) Field of Classification Search
CPC ......... H01L 27/14692; H01L 27/14636; H01L 27/14685; H01L 2224/08145;
(Continued)

(56) References Cited

U.S. PATENT DOCUMENTS

2012/0193741 A1   8/2012  Borthakur et al.
2013/0040415 A1   2/2013  Arakawa et al.
(Continued)

FOREIGN PATENT DOCUMENTS

CN   102956654 A    3/2013
CN   104981907 A   10/2015
(Continued)

OTHER PUBLICATIONS

International Search Report and Written Opinion of PCT Application No. PCT/JP2020/028952, issued on Oct. 13, 2020, 09 pages of ISRWO.

*Primary Examiner* — Mohammed R Alam
(74) *Attorney, Agent, or Firm* — SHERIDAN ROSS P.C.

(57) ABSTRACT

A reduction in the visibility of an alignment mark of an imaging device configured by bonding a plurality of semiconductor substrates together is prevented. An imaging element includes a semiconductor substrate, a pad, an alignment mark, and a light shielding film. The semiconductor substrate includes a pixel region which is a region in which pixels for generating an image signal in accordance with incident light are disposed. The pad is disposed on a surface side of the semiconductor substrate. The alignment mark is disposed on a back surface side of the semiconductor substrate. The light shielding film is disposed between the pad and the alignment mark.

12 Claims, 15 Drawing Sheets

(58) Field of Classification Search
CPC . H01L 21/3205; H01L 21/768; H01L 23/522; H01L 25/065; H01L 25/07; H01L 25/18; H01L 27/146; H04N 25/00
See application file for complete search history.

(56) References Cited

U.S. PATENT DOCUMENTS

| | | |
|---|---|---|
| 2014/0197511 A1 | 7/2014 | Borthakur et al. |
| 2015/0348914 A1* | 12/2015 | Takazawa ............ H01L 27/1464 257/435 |
| 2016/0172405 A1 | 6/2016 | Hori |
| 2016/0233267 A1 | 8/2016 | Borthakur et al. |
| 2017/0345863 A1 | 11/2017 | Hori |
| 2018/0323231 A1* | 11/2018 | Saito ................. H01L 27/14636 |
| 2021/0036179 A1* | 2/2021 | Sung .................. H01L 31/1888 |

FOREIGN PATENT DOCUMENTS

| | | |
|---|---|---|
| CN | 105702693 A | 6/2016 |
| EP | 2958146 A1 | 12/2015 |
| JP | 2008-147332 A | 6/2008 |
| JP | 2009-259934 A | 11/2009 |
| JP | 2011-044655 A | 3/2011 |
| JP | 2013-041940 A | 2/2013 |
| JP | 2014-157885 A | 8/2014 |
| JP | 2016-115757 A | 6/2016 |
| KR | 10-2016-0072028 A | 6/2016 |
| TW | 201633520 A | 9/2016 |
| WO | 2014/125969 A1 | 8/2014 |

\* cited by examiner

IMAGING ELEMENT AND IMAGING DEVICE

CROSS REFERENCE TO RELATED APPLICATIONS

This application is a U.S. National Phase of International Patent Application No. PCT/JP2020/028952 filed on Jul. 29, 2020, which claims priority benefit of Japanese Patent Application No. JP 2019-203127 filed in the Japan Patent Office on Nov. 8, 2019. Each of the above-referenced applications is hereby incorporated herein by reference in its entirety.

TECHNICAL FIELD

The present disclosure relates to an imaging element and an imaging device. More particularly, the present disclosure relates to an imaging element configured by bonding a plurality of semiconductor chips together, and an imaging device.

BACKGROUND ART

In recent years, a semiconductor device configured by bonding a plurality of semiconductor chips together has been used. For example, an imaging device configured by bonding an imaging chip and an arithmetic chip together has been used. In the imaging chip, pixels generating image signals by performing photoelectric conversion of incident light are disposed. The arithmetic chip processes the generated image signals. In such a semiconductor device, it is necessary to transmit a signal between the bonded semiconductor chips. As a method of transmitting the signal, a semiconductor device that forms electrical connection by a pad being disposed on a bonding surface of each of the semiconductor chips and the pads of the respective semiconductor chips being joined together at the time of bonding, and transmits a signal has been proposed.

For example, a semiconductor device configured by bonding a first semiconductor substrate and a second semiconductor substrate together has been proposed (see, for example, PTL 1). A first pad is disposed in an interlayer insulating film of an uppermost layer of the first semiconductor substrate, and a second pad is disposed in an interlayer insulating film of an uppermost layer of the second semiconductor substrate. At the time of bonding, the interlayer insulating films of the uppermost layers are joined together, and the first pad and the second pad are joined together. The second pad is formed to be wider than the first pad and is formed of a metal having a lower diffusivity to the interlayer insulating film than that of the first pad. Diffusion of a metal due to a positional deviation is reduced.

CITATION LIST

Patent Literature

[PTL 1]
  JP 2011-044655 A

SUMMARY

Technical Problem

In the above-described related art, there is a problem in that the visibility of an alignment mark is reduced. The alignment mark is an alignment mark which is a reference at the time of dicing, formation of a pad on which an inspection probe abuts, and the like in a bonded semiconductor substrate. When the alignment mark is used, it is necessary to visually recognize reflected light by irradiating the semiconductor substrate with light, but reflected light from a pad disposed in a layer below the alignment mark may be incorporated, thereby reducing visibility. It is possible to prevent a reduction in the visibility of the alignment mark by deleting the pad of the layer below the alignment mark. However, in this case, the flatness of the interlayer insulating film is impaired, which results in a problem such as the formation of voids.

The present disclosure is contrived in view of the above-described problems, and an object thereof is to prevent a reduction in the visibility of an alignment mark while maintaining the flatness of an imaging device configured by bonding a plurality of semiconductor substrates.

Solution to Problem

The present disclosure is contrived in view of the above-described problems, and a first aspect thereof is an imaging element including a semiconductor substrate that includes a pixel region which is a region in which pixels for generating an image signal in accordance with incident light are disposed, a pad that is disposed on a surface side of the semiconductor substrate, an alignment mark that is disposed on a back surface side of the semiconductor substrate, and a light shielding film that is disposed between the pad and the alignment mark.

Further, in the first aspect, the light shielding film may be disposed on the surface side of the semiconductor substrate.

Further, in the first aspect, the light shielding film may be disposed on the back surface side of the semiconductor substrate.

Further, in the first aspect, the imaging element may further include a second alignment mark disposed between the pad and the light shielding film.

Further, in the first aspect, the alignment mark may be disposed in a region different from the pixel region.

Further, in the first aspect, the alignment mark may be disposed adjacent to the pixel region.

Further, in the first aspect, the semiconductor substrate may be a semiconductor chip.

Further, in the first aspect, the alignment mark may be disposed at a peripheral edge portion of the semiconductor chip.

Further, in the first aspect, the alignment mark may be disposed outside the semiconductor chip.

Further, in the first aspect, the light shielding film may be formed of a metal.

Further, in the first aspect, the semiconductor substrate may further include a wiring region having a wiring disposed on the surface side and connected to the pixels, the pad may be disposed on a surface of the wiring region, and the light shielding film may be disposed in the same layer as the wiring.

Further, in the first aspect, the imaging element may further include a second semiconductor substrate that includes a second pad, and the pad may be joined to the second pad.

Further, in the first aspect, a processing circuit processing the generated image signal may be disposed in the second semiconductor substrate.

In addition, a second aspect of the present disclosure is an imaging device including an imaging element including a semiconductor substrate that includes a pixel region which is a region in which pixels for generating an image signal in accordance with incident light are disposed, a pad that is disposed on a surface side of the semiconductor substrate, an alignment mark that is disposed on a back surface side of the semiconductor substrate, and a light shielding film that is disposed between the pad and the alignment mark, and a processing circuit that processes the generated image signal.

By adopting such aspects, an effect of disposing a light shielding film between the pad and the alignment mark is obtained. It is assumed that reflected light from the pad is shielded.

DESCRIPTION OF EMBODIMENTS

Figure 1:
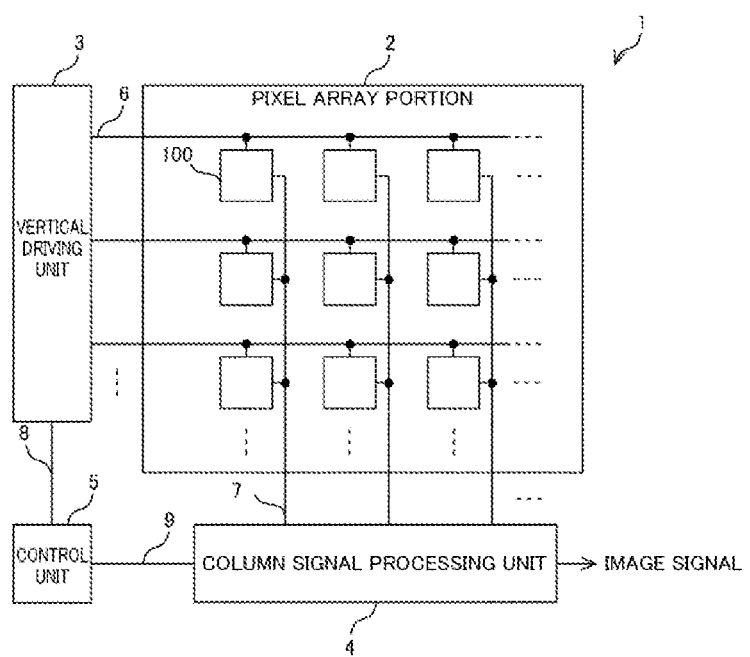
FIG. 1 is a diagram illustrating a configuration example of an imaging element according to an embodiment of the present disclosure.

Next, embodiments for implementing the present disclosure (hereinafter, referred to as embodiments) will be described with reference to the drawings. In the following drawings, the same or similar portions are denoted by the same or similar reference numerals and signs. In addition, the embodiments will be described in the following order.

1. First Embodiment
2. Second Embodiment
3. Third Embodiment
4. Fourth Embodiment
5. Fifth Embodiment
6. Example of application to camera 1. First Embodiment

[Configuration of Imaging Element]

FIG. 1 is a diagram illustrating a configuration example of an imaging element according to an embodiment of the present disclosure. In the drawing, an imaging element 1 includes a pixel array portion 2, a vertical driving unit 3, a column signal processing unit 4, and a control unit 5.

The pixel array portion 2 is configured such that pixels 100 are disposed in a two-dimensional lattice form. Here, the pixels 100 generate an image signal corresponding to emitted light. Each of the pixels 100 includes a photoelectric conversion unit that generates charge corresponding to emitted light. In addition, each of the pixels 100 further includes a pixel circuit. The pixel circuit generates an image signal based on charge generated by the photoelectric conversion unit. The generation of the image signal is controlled by a control signal generated by the vertical driving unit 3, which will be described later. Signal lines 6 and 7 are disposed in an XY matrix form in the pixel array portion 2. The signal line 6, which is a signal line for transmitting a control signal of the pixel circuit in the pixel 100, is disposed for each row of the pixel array portion 2 and wired in common for the pixels 100 disposed in each row. The signal line 7, which is a signal line for transmitting an image signal generated by the pixel circuit of the pixel 100, is disposed for each column of the pixel array portion 2 and is wired in common for the pixels 100 disposed in each column. The photoelectric conversion unit and the pixel circuit are formed on a semiconductor substrate.

The vertical driving unit 3 generates a control signal of the pixel circuit of the pixel 100. The vertical driving unit 3 transmits the generated control signal to the pixels 100 through the signal lines 6 in the drawing. The column signal processing unit 4 processes image signals generated by the pixels 100. The column signal processing unit 4 processes the image signals transmitted from the pixels 100 through the signal lines 7 in the drawing. The processing in the column signal processing unit 4 corresponds to, for example, analog-to-digital conversion of converting an analog image signal generated in the pixels 100 into a digital image signal. The image signal processed by the column signal processing unit 4 is output as an image signal of the imaging element 1. The control unit 5 controls the imaging element 1 as a whole. The control unit 5 generates and outputs control signals for controlling the vertical driving unit 3 and the column signal processing unit 4 to control the imaging element 1. The control signals generated by the control unit 5 are transmitted to the vertical driving unit 3 and the column signal processing unit 4 through signal lines 8 and 9.

The imaging element 1 in the drawing can be constituted by a plurality of semiconductor chips. For example, the imaging element 1 can be constituted by two semiconductor chips, that is, an imaging chip which is a semiconductor chip in which the pixel array portion 2 in the drawing is disposed and an arithmetic chip which is a semiconductor chip in which the vertical driving unit 3, the column signal processing unit 4, and the control unit 5 are disposed. The pixel array portion 2 is constituted by an analog circuit to which a relatively high power supply voltage is applied. On the other hand, the vertical driving unit 3 and the column signal processing unit 4 are mainly constituted by a digital circuit, and are operated at high speed by a relatively low power supply voltage applied thereto. Such circuits having different properties are disposed to be divided into a plurality of semiconductor chips, and thus an optimal process for each of the circuits can be applied to the manufacture of the semiconductor chips. The cost can be reduced. In addition, miniaturization can be achieved by laminating the semiconductor chips. Note that the imaging element 1 in the drawing constitutes an imaging device in a case where the column signal processing unit 4 is disposed as a processing circuit that processes an image signal.

The imaging chip in which the pixels 100 are disposed is disposed on the front side (light receiving surface side) of the imaging element 1 and is irradiated with incident light. The arithmetic chip is laminated on the back side of the imaging chip which is a surface different from the light receiving surface of the imaging element 1.

[Planar Configuration of Imaging Element]

Figure 2:
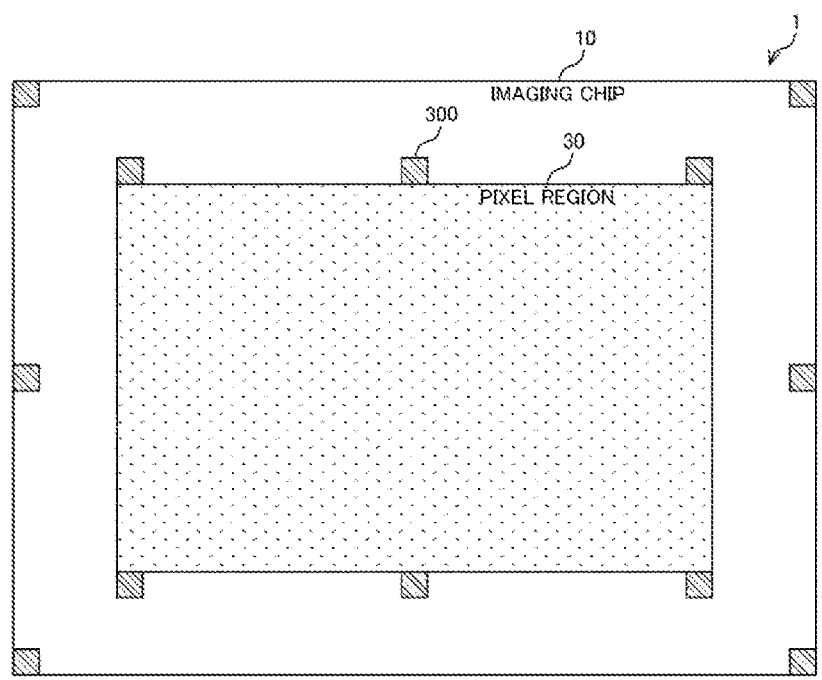
FIG. 2 is a plan view illustrating a configuration example of the imaging element according to the embodiment of the present disclosure.

FIG. 2 is a plan view illustrating a configuration example of the imaging element according to the embodiment of the present disclosure. The drawing is a plan view illustrating a configuration example of the imaging element 1. The imaging element 1 in the drawing includes an imaging chip 10 and an arithmetic chip 20 (not illustrated). The arithmetic chip 20 is disposed in a layer below the imaging chip 10 in the drawing. Details of configurations of the imaging chip 10 and the arithmetic chip 20 will be described in detail.

In the imaging chip 10, the pixel array portion 2 described in FIG. 1 is disposed, and the plurality of pixels 100 are disposed. The drawing illustrates a configuration of the imaging chip 10 on the light receiving surface side of the imaging element 1, and a pixel region 30 is disposed at the central portion of the imaging chip 10. The plurality of pixels 100 are arranged in the pixel region 30.

In addition, an alignment mark region 300 is disposed in the imaging chip 10. The alignment mark region 300 is a region in which an alignment mark 301 to be described later is disposed. A rectangle with hatched diagonal lines in the drawing indicates the alignment mark region 300. The alignment mark region 300 indicates a three-dimensional region from the surface of the imaging element 1 to the rear surface thereof, and is a region over the entire region in the thickness direction of the imaging element 1. That is, the alignment mark region 300 includes a region between the back surface side of the imaging chip 10 and the back surface side of the arithmetic chip 20. One or a plurality of alignment marks 301 are disposed in the imaging chip 10 included in the alignment mark region 300, or the like. When the plurality of alignment marks 301 are disposed in the alignment mark region 300, the alignment marks 301 can be disposed in a different layer of a member constituting the imaging chip 10 or the like in the region. In this case, the alignment marks can also be disposed at an overlapping position when seen in a plan view.

The alignment mark 301 is a mark indicating a reference of the position of the imaging element 1, the imaging chip 10 constituting the imaging element 1, or the like. The alignment mark 301 is used in the manufacturing process for the imaging element 1. For example, the alignment mark 301 is used as a reference of a position when a mask is attached in an exposure process at the time of manufacturing the imaging chip 10. In this case, the alignment mark 301 is visually recognized by an exposure device or the like used in the exposure process and is used as a reference of a position. In addition, the alignment mark 301 can also be used for alignment at the time of bonding the semiconductor chips. In addition, the alignment mark 301 can also be used as a process management monitor for a line width of a wiring or the like, measurement of a film thickness and a positional deviation in the manufacturing process, and the like. Details of the configuration of the alignment mark 301 will be described later.

As illustrated in the drawing, a plurality of alignment mark regions 300 can be disposed and can be disposed adjacent to the pixel region 30. In addition, the alignment mark region 300 can also be disposed in a peripheral edge portion of the imaging chip 10. For example, the alignment mark region 300 can also be disposed adjacent to the side or corner of the imaging chip 10. In addition, the alignment mark region 300 can also be disposed in an intermediate region between ends of the pixel region 30 and the imaging chip 10. In this manner, the alignment mark region 300 can be disposed in a region different from the pixel region 30.

[Configuration of Alignment Mark]

Figure 3:
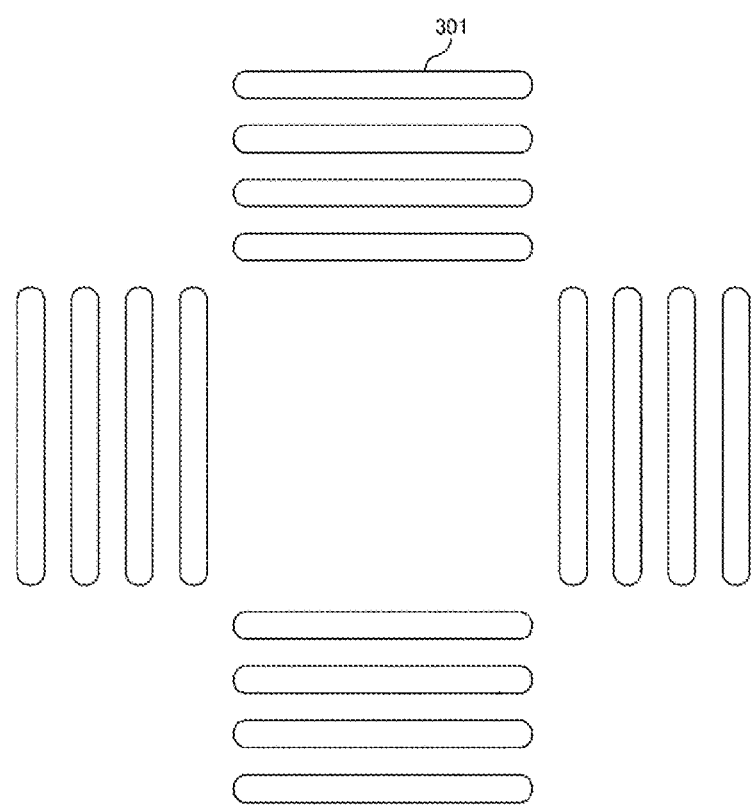
FIG. 3 is a diagram illustrating a configuration example of an alignment mark according to the embodiment of the present disclosure.

FIG. 3 is a diagram illustrating a configuration example of the alignment mark according to the embodiment of the present disclosure. The drawing is a diagram illustrating a configuration example of the alignment mark 301. The alignment mark 301 in the drawing is constituted by a member or the like which can be optically recognized. The alignment mark 301 can be configured to have a graphic shape such as a triangle in addition to a linear shape illustrated in the drawing. The alignment mark in the drawing indicates an example in which four sets each having four linear alignment marks 301 disposed in parallel are arranged in different directions. The alignment mark 301 can be constituted by a member constituting the imaging chip 10 or the like. The alignment mark 301 can be formed of, for example, a metal material such as copper (Cu), aluminum (Al), or tungsten (W), a semiconductor such as silicon (Si), an inorganic compound such as silicon oxide ($SiO_2$), and an organic material such as a resin. In addition, the alignment mark 301 can also be constituted by a groove, a void, or the like formed in these members. The alignment mark 301 can be constituted by a material corresponding to a process to be used.

[Cross-Sectional Configuration of Imaging Element]

Figure 4:
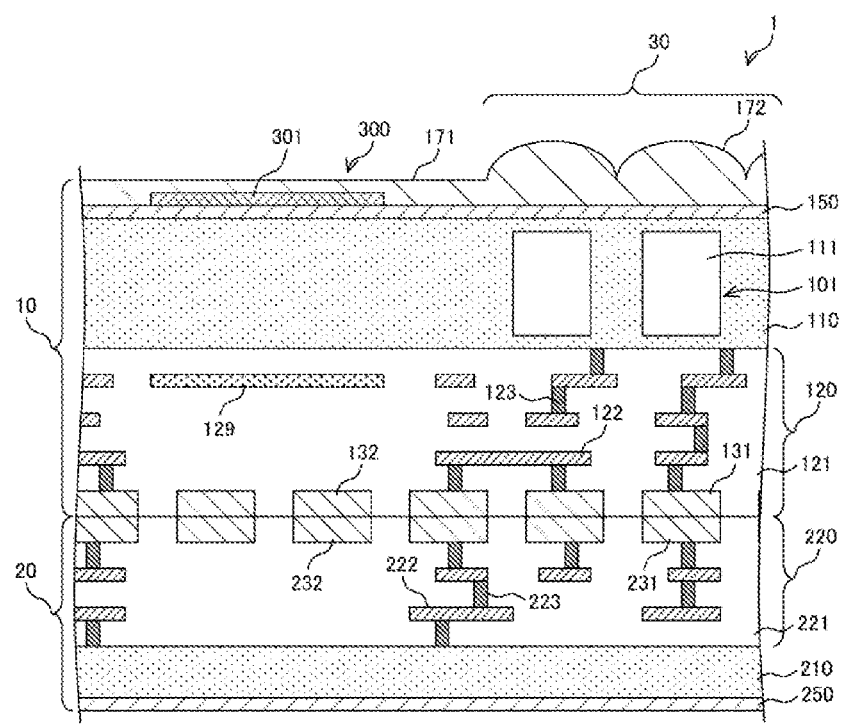
FIG. 4 is a cross-sectional view illustrating a configuration example of an imaging element according to a first embodiment of the present disclosure.

FIG. 4 is a cross-sectional view illustrating a configuration example of an imaging element according to a first embodiment of the present disclosure. The drawing is a cross-sectional view illustrating a configuration example of an imaging element 1. As described above, the imaging element 1 includes an imaging chip 10 and an arithmetic chip 20. The imaging chip 10 and the arithmetic chip 20 are bonded to each other to be laminated on each other. Note that, hereinafter, a surface side of the semiconductor substrate 110 or the like indicates a side adjacent to the front surface side of a semiconductor substrate 110 or the like, and a back surface side of the semiconductor substrate 110 or the like indicates a side adjacent to the back surface side of the semiconductor substrate 110 or the like.

The imaging chip 10 includes the semiconductor substrate 110, a wiring region 120, projection films 150 and 171, an alignment mark 301, and a light shielding film 129. In addition, pads 131 and 132 are disposed in the wiring region 120. The alignment mark 301 is disposed in the alignment mark region 300. The imaging element 1 in the drawing indicates an example in which the alignment mark region 300 is disposed in the vicinity of the pixel region 30 of the imaging chip 10. A plurality of pixels 100 are disposed in the pixel region 30, and an on-chip lens 172 is disposed in the pixel 100.

The semiconductor substrate 110 is a semiconductor substrate in which the photoelectric conversion unit described in FIG. 1 and a diffusion region of an element of a pixel circuit are formed. The semiconductor substrate 110 can be formed of, for example, silicon (Si). As will be described later, the semiconductor substrate 110 is configured in a semiconductor chip. The diffusion region of the element can be formed by forming, for example, a well region configured as a p-type in the semiconductor substrate 110 and disposing an n-type semiconductor region in the well region. A photoelectric conversion unit 101 is illustrated in the drawing as an example. The photoelectric conversion unit 101 in the drawing is constituted by an n-type semiconductor region 111. Specifically, a photodiode including a pn junction constituted by the n-type semiconductor region 111 and the surrounding p-type well region is equivalent to the photoelectric conversion unit 101.

The wiring region 120 is a region in which a wiring for transmitting a signal to the element of the semiconductor substrate 110, and the like is formed. The wiring region 120 is disposed adjacent to the front surface side of the semiconductor substrate. The wiring region 120 includes a wiring layer 122, an interlayer insulating film 121, a via plug 123, and the pads 131 and 132. The wiring layer 122 is a wiring for transmitting a signal. The wiring layer 122 can be formed of a metal such as Cu or W. The interlayer insulating film 121 insulates the wiring layer 122. The interlayer insulating film 121 can be formed of an insulating material such as silicon oxide ($SiO_2$).

The wiring layer 122 and the interlayer insulating film 121 can be configured as multiple layers. The drawing illustrates an example in which the wiring layer 122 and the interlayer insulating film 121 are configured in three layers. The wiring layers 122 in different layers can be connected to each other by the via plug 123. The via plug 123 can be formed of columnar metal such as Cu or W. In addition, the via plug 123 can also be disposed between the wiring layer 122 and the semiconductor substrate 110. Note that a light shielding film 129 to be described later is disposed in the wiring region 120.

The pads 131 and 132 are electrodes that are disposed on the surface of the wiring region 120. The pads 131 and 132 are respectively joined to pads 231 and 232 of the arithmetic chip 20 to be described later. The pads 131 and 132 can be formed of a metal such as Cu or gold (Au), and are configured to have a shape embedded in the interlayer insulating film 121 which is the outermost layer of the wiring region 120. Details of configurations of the pads 131 and 132 will be described later.

The projection film 150 is a film that protects the back surface side of the semiconductor substrate 110. The projection film 150 can be formed of, for example, $SiO_2$ or silicon nitride (SiN).

The on-chip lens 172 is a lens which is disposed for each pixel 100 to concentrate incident light on the photoelectric conversion unit 101. The on-chip lens 172 is configured in a hemispherical shape to concentrate incident light. The on-chip lens 172 can be formed of an inorganic material such as SiN or an organic material such as acrylic resin.

The projection film 171 is a film that protects the back surface side of the semiconductor substrate 110 in a region other than the pixel region 30. The projection film 171 can be formed of the same material as that of the on-chip lens 172.

The light shielding film 129 is a film that which is disposed between the pad 132, which is a pad disposed in a layer below the alignment mark 301, and the alignment mark 301 to shield light emitted from the surface side of the imaging chip 10. The light shielding film 129 can be formed of a metal such as Cu, Al, or Au. The light shielding film 129 is disposed on the surface side of the semiconductor substrate 110. In addition, the light shielding film 129 can be disposed in the wiring region 120, and can be disposed in the same layer and formed of the same material as the wiring layer 122. In this case, the light shielding film 129 can be formed at the same time as the wiring layer 122.

The arithmetic chip 20 includes a semiconductor substrate 210, a wiring region 220, and a projection film 250.

The semiconductor substrate 210 is a semiconductor substrate in which a diffusion region of an element such as the column signal processing unit 4 described in FIG. 1 is formed. The semiconductor substrate 210 can be formed of Si, similar to the semiconductor substrate 110. Description of the diffusion region of the element of the semiconductor substrate 210 is omitted.

The wiring region 220 includes a wiring layer 222, an interlayer insulating film 221, a via plug 223, and the pads 231 and 232. The pads 231 and 232 are electrodes disposed on the surface of the wiring region 220 similar to the pads 131 and 132, and are configured to have a shape embedded in the interlayer insulating film 221 which is an outermost layer.

The imaging chip 10 and the arithmetic chip 20 are bonded to each other to constitute the imaging element 1. The bonding is executed by joining the surfaces of the wiring region 120 of the imaging chip 10 and the wiring region 220 of the arithmetic chip 20 together. The bonding can be performed by activating the surfaces of the pads 131 and 231 and the surfaces of the interlayer insulating films 121 and 221 which are the outermost layers of the wiring regions 120 and 220 and then performing heating and pressing thereon. In this case, the pad 131 of the imaging chip 10 and the pad 231 of the arithmetic chip 20 are aligned and bonded to each other. Thereby, the pads 131 and 231 are electrically connected to each other to transmit a signal to each other. Note that the pad 132 of the imaging chip 10 is also joined to the pad 232 of the arithmetic chip 20. Note that the semiconductor substrate 210 is an example of a second semiconductor substrate recited in the claims. The pad 232 is an example of a second pad recited in the claims.

The alignment mark 301 in the drawing is disposed on the back surface side of the semiconductor substrate 110 through the projection film 150. The surface of the alignment mark 301 is protected by the projection film 171. As illustrated in the drawing, the alignment mark 301 is disposed in a region different from the pixel region 30. The alignment mark 301 in the drawing is an alignment mark which is used in a process after the imaging chip 10 and the arithmetic chip 20 are bonded to each other. Specifically, the alignment mark 301 can be used as a reference at the time of the formation of the on-chip lens 172 and the formation and dicing of a pad on which an inspection probe for inspecting the imaging element 1 abuts.

As illustrated in the drawing, the pad 131 is a pad which is not disposed in the layer below the alignment mark 301. The pad 131 is disposed in, for example, the pixel region 30 so as to be connected to the wiring layer 122 and the via plug 123 and contributes to the transmission of a signal.

On the other hand, the pad 132 is a pad which is disposed in the wiring region 120 of the layer below the alignment mark 301. The pad 132 in the drawing is a pad which is not connected to the wiring layer 122 and the like and does not contribute to the transmission of a signal. The pad 132 is referred to as a dummy pad.

The pad 132 is disposed in the wiring region 120 of the layer below the alignment mark 301, and thus the alignment mark 301 and the pad 132 are configured to overlap each other. In a case where the light shielding film 129 in the drawing is not disposed, light reflected by the pad 132 is emitted to the alignment mark 301 when the alignment mark 301 is visually recognized from the back side of the imaging chip 10 (a light receiving surface side of the imaging element 1), and thus visibility is reduced. The accuracy of alignment is reduced. It is possible to prevent a reduction in visibility at the time of alignment by omitting the pad 132 and the pad 232 of the arithmetic chip 20. However, when the pad 132 and the like are omitted, a defect occurs in the wiring region 120 of the alignment mark region 300. For example, the flatness of the wiring region 120 of the alignment mark region 300 is reduced, thereby generating voids. Thereby, the strength of the imaging element 1 is reduced.

Consequently, the light shielding film 129 is disposed between the pad 132 and the alignment mark 301 to shield light incident on the alignment mark 301 from the surface side of the semiconductor substrate 110. Thereby, light reflected to the side of the semiconductor substrate 110 by the pad 132 is shielded, and it is possible to prevent a reduction in the visibility of the alignment mark 301.

Further, the configuration of the imaging element 1 is not limited to this example. For example, it is also possible to adopt a configuration in which the wiring layer 122 is disposed between the light shielding film 129 and the pad 132 of the alignment mark region 300. In addition, the wiring layer 122 can also be connected to the pad 132. In addition, the light shielding film 129 can also be extended to the outside of the alignment mark region 300. In addition, a wiring region can also be further disposed on the back surface side of the arithmetic chip 20.

[Effects of Light Shielding Film]

Figure 5A:
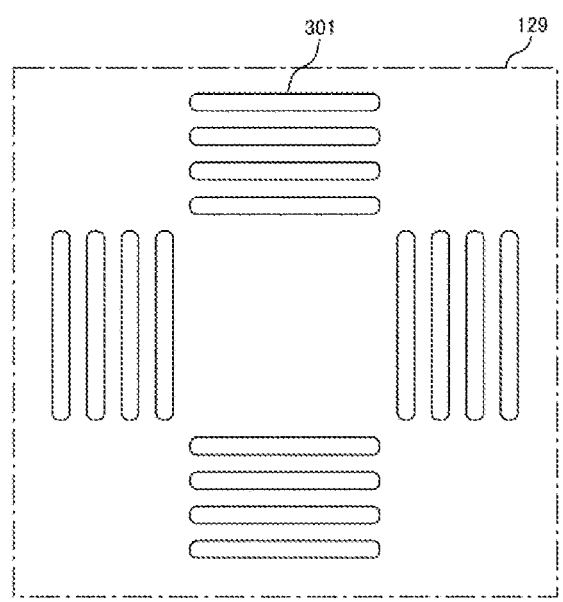
FIGS. 5A and 5B are diagrams illustrating an example of light shielding according to the embodiment of the present disclosure.
Figure 5B:
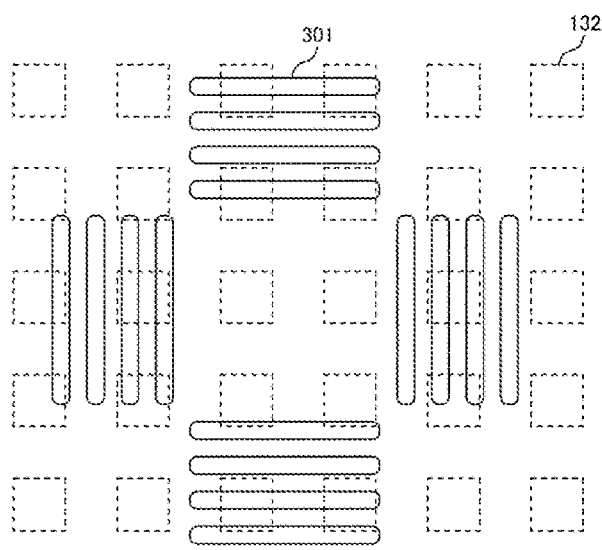

FIGS. 5A and 5B are diagrams illustrating an example of light shielding according to the embodiment of the present disclosure. The drawing is a diagram illustrating effects of the light shielding film 129. FIG. 5A indicates a diagram illustrating a case where the light shielding film 129 is disposed. An alternating dotted-dashed rectangle of FIG. 5A, indicates the light shielding film 129 which is disposed in the layer below the alignment mark 301. In a case where alignment is performed by an exposure device or the like, the alignment mark 301 is irradiated with light and is imaged, and the shape of a counter of the alignment mark 301, or the like is recognized. Because the light shielding film 129 is disposed, light from a member of the layer below the alignment mark 301 is shielded, and it is possible to recognize a clear image of the alignment mark 301.

FIG. 5B is a diagram illustrating an example of a case where the light shielding film 129 is not disposed. A dashed rectangle of FIG. 5B indicates the pad 132 which is disposed in the layer below the alignment mark 301. Light from a light source such as an exposure device is emitted to the alignment mark 301, passes through the semiconductor substrate 110, reaches the pad 132, and is reflected by the pad 132. Because the reflected light is imaged in an overlapping manner, the contour of the alignment mark 301, and the like cannot be clearly recognized, and visibility is reduced. For this reason, the accuracy of alignment is reduced.

In this manner, the visibility of the alignment mark 301 can be improved by disposing the light shielding film 129. Note that it is preferable that the light shielding film 129 be disposed in a layer in close vicinity to the alignment mark 301. This is because light is reflected from the light shielding film 129 positioned near the alignment mark 301, so that the shadow of the alignment mark 301 is clearly reflected on the light shielding film 129 and the contrast is improved.

[Method of Manufacturing Imaging Element]

Figure 6A:
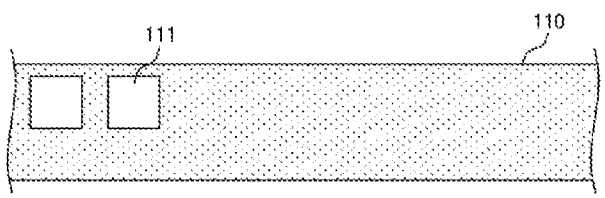
FIGS. 6A, 6B, 6C, and 6D are diagrams illustrating an example of a method of manufacturing the imaging element according to the first embodiment of the present disclosure.

FIGS. 6A, 6B, 6C, 6D, 7A, 7B, and 7C are diagrams illustrating an example of a method of manufacturing the imaging element according to the first embodiment of the present disclosure. FIGS. 6A, 6B, 6C, 6D, 7A, 7B, and 7C are diagrams illustrating an example of a manufacturing process of the imaging element 1. First, the semiconductor region 111 and the like are formed in the semiconductor substrate 110 (FIG. 6A).

Next, the interlayer insulating film 121 is disposed on the semiconductor substrate 110. This can be performed by forming a material film of the interlayer insulating film 121, such as SiO2, by using Chemical Vapor Deposition (CVD).

Figure 6B:
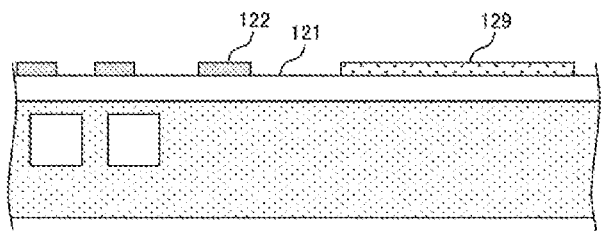

Next, the wiring layer 122 and the light shielding film 129 are disposed. This can be performed by forming material films of the wiring layer 122 and the light shielding film 129, such as Cu, by plating or the like (FIG. 6B). The process corresponds to a light shielding film forming process.

Figure 6C:
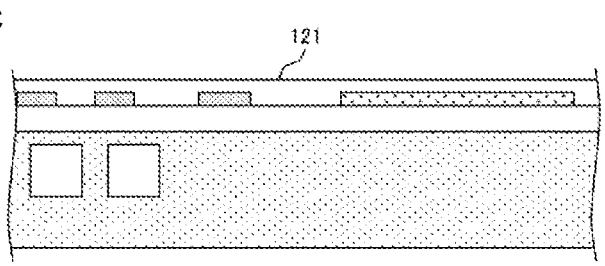

Next, the interlayer insulating film 121 is laminated (FIG. 6C). Note that the wiring layer 122 and the interlayer insulating film 121 can be formed by a required number of layers. In addition, a via plug 123 not illustrated in the drawing is formed.

Figure 6D:
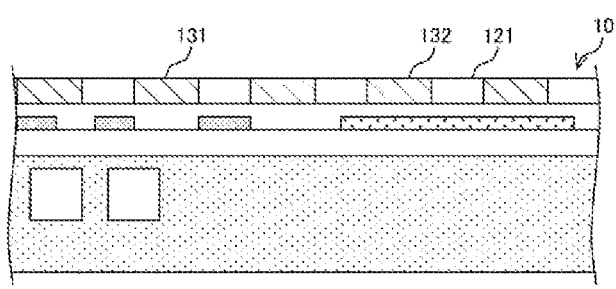

Next, the pads 131 and 132 are formed. This can be performed by forming an opening in a region in which the pads 131 and 132 of the interlayer insulating film 121 which is an outermost layer are formed, and disposing the material films of the pads 131 and 132, such as Cu, in the opening (FIG. 6D). The process corresponds to a pad forming process. Thereby, the wiring region 120 of the imaging chip 10 can be formed.

Figure 7A:
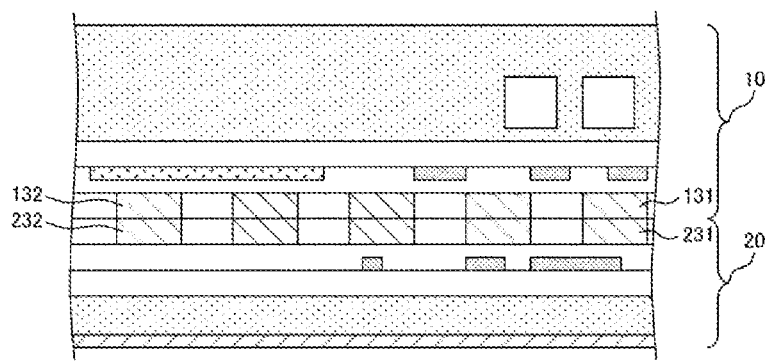
FIGS. 7A, 7B, and 7C are diagrams illustrating an example of a method of manufacturing the imaging element according to the first embodiment of the present disclosure.

Next, the arithmetic chip 20 and the imaging chip 10 that are formed by the same configuration are bonded to each other. First, activation of the interlayer insulating films 121 and 221 on the surface of the wiring region of each of the semiconductor chips and removal of the oxide film on the surfaces of the pads 131, 132, 231, and 232 are performed. This can be performed by plasma treatment. Next, the positions of the pads 131 and 231 and the pads 132 and 232 are aligned, and the imaging chip 10 and the arithmetic chip 20 are brought into close contact with each other and are heated and pressed. Thereby, the interlayer insulating films 121 and 221 are joined together, and the pads 131 and 231 and the pads 132 and 232 are joined together. The imaging chip 10 and the arithmetic chip 20 can be bonded to each other (FIG. 7A). The process corresponds to a bonding process.

Figure 7B:
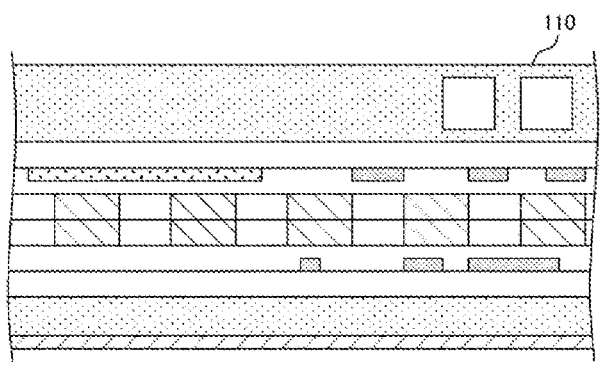

Next, the back surface side of the semiconductor substrate 110 of the imaging chip 10 is ground to be thinned. This can be performed by, for example, Chemical Mechanical Polishing (CMP) (FIG. 7B).

Next, the projection film 150 is disposed on the back surface side of the imaging chip 10. This can be performed by forming a film such as $SiO_2$ by CVD or the like.

Figure 7C:
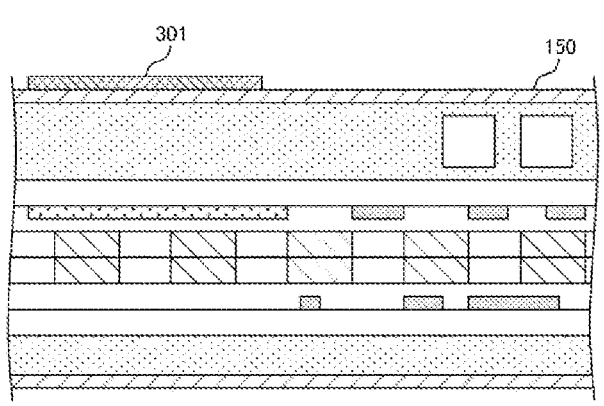

Next, the alignment mark 301 is disposed. This can be performed by forming a material film of the alignment mark 301 such as Cu by sputtering or the like and deleting an unnecessary portion (FIG. 7C). The process corresponds to an alignment mark forming process.

Thereafter, the projection film 171 and the on-chip lens 172 are disposed to form the imaging element 1 having a wafer shape. The imaging element 1 can be manufactured by dicing the wafer into individual pieces.

As described above, in the imaging element 1 according to the first embodiment of the present disclosure, the light shielding film 129 is disposed between the pad 132 and the alignment mark 301 of the imaging chip 10, and light from the pad 132 of the layer below the alignment mark 301 is shielded. Thereby, it is possible to obtain a clear image of the alignment mark 301 at the time of performing alignment using the alignment mark 301. Even when the pad 132 is disposed at a position overlapping the alignment mark 301, it is possible to prevent a reduction in the visibility of the alignment mark 301. It is possible to prevent a reduction in the visibility of the alignment mark while maintaining the flatness of the wiring region 120 in the vicinity of the alignment mark 301 and preventing the generation of voids and the like. It is possible to prevent a reduction in the accuracy of alignment.

2. Second Embodiment

In the imaging element 1 according to the above-described first embodiment, the alignment mark 301 is disposed. On the other hand, an imaging element 1 according to a second embodiment of the present disclosure is different from that in the above-described first embodiment in that a plurality of alignment marks are disposed.

[Cross-Sectional Configuration of Imaging Element]

Figure 8:
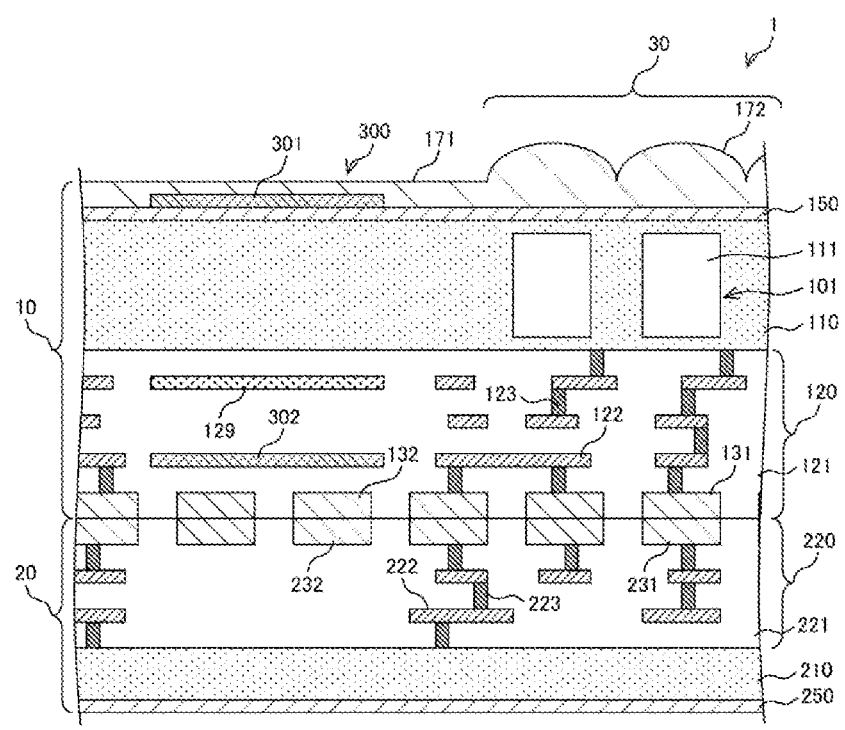
FIG. 8 is a cross-sectional view illustrating a configuration example of an imaging element according to a second embodiment of the present disclosure.

FIG. 8 is a cross-sectional view illustrating a configuration example of the imaging element according to the second embodiment of the present disclosure. The drawing is a cross-sectional view illustrating a configuration example of the imaging element 1, similar to FIG. 4. The imaging element 1 is different from the imaging element 1 in FIG. 4 in that an alignment mark 302 is further disposed.

The alignment mark 302 is an alignment mark which is disposed in an alignment mark region 300, similar to the alignment mark 301. The alignment mark 302 is disposed between a light shielding film 129 and a pad 132. The alignment mark 302 is an alignment mark which is used before the alignment mark is bonded to an arithmetic chip 20. The alignment mark 302 in the drawing can be used for alignment at the time of forming a wiring layer 122 and forming a pad 131 and the like. A plurality of alignment marks can be disposed in the alignment mark region 300, and the alignment mark region 300 can be reduced as compared with a case where the alignment marks 301 are disposed one by one in the alignment mark region 300. Note that the alignment mark 302 is an example of a second alignment mark recited in the claims.

Further, the configuration of the imaging element 1 is not limited to this example. For example, it is also possible to adopt a configuration in which a plurality of alignment marks are disposed between a light shielding film 129 and a pad 132.

A configuration of the imaging element 1 other than the above-described configuration is the same as the configuration of the imaging element 1 described in the first embodiment of the present disclosure and thus description thereof will be omitted.

As described above, in the imaging element 1 according to the second embodiment of the present disclosure, a plurality of alignment marks can be disposed in the alignment mark region 300 by disposing the alignment mark 302 between the light shielding film 129 and the pad 132. Thereby, it is possible to reduce the alignment mark region 300 and expand an effective region of a semiconductor chip. In the imaging chip 10, a pixel region 30 can be expanded.

3. Third Embodiment

In the imaging element 1 according to the above-described first embodiment, the light shielding film 129 is disposed on the surface side of the imaging chip 10. On the other hand, an imaging element 1 according to a third embodiment of the present disclosure is different from that in the above-described first embodiment in that a light shielding film is disposed on a back surface side of an imaging chip 10.

[Cross-Sectional Configuration of Imaging Element]

Figure 9:
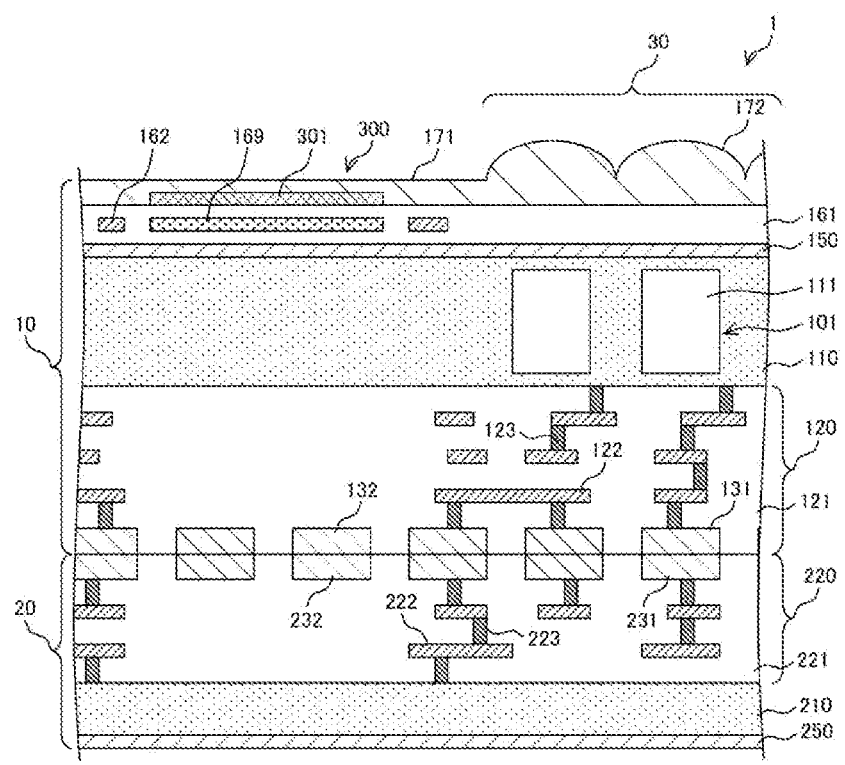
FIG. 9 is a cross-sectional view illustrating a configuration example of an imaging element according to a third embodiment of the present disclosure.

FIG. 9 is a cross-sectional view illustrating a configuration example of the imaging element according to the third embodiment of the present disclosure. The drawing is a cross-sectional view illustrating a configuration example of the imaging element 1, similar to FIG. 4. The imaging element is different from the imaging element 1 in FIG. 4 in that a light shielding film 169 is disposed instead of the light shielding film 129.

The light shielding film 169 is a light shielding film which is disposed on the back surface side of the imaging chip 10. The light shielding film 169 can be formed of a metal such as Cu, similar to the light shielding film 129. In the imaging chip 10 in the drawing, an interlayer insulating film 161 and a wiring layer 162 are disposed adjacent to a projection film 150. The light shielding film 169 is disposed in the same layer as the interlayer insulating film 161 and shields light from a pad 132. The light shielding film 169 can be formed at the same time as the wiring layer 162. Note that the light shielding film 169 is disposed adjacent to the back surface side of a semiconductor substrate 110 through the projection film 150 and the interlayer insulating film 161. The light shielding film 169 is disposed on the back surface side of the imaging chip 10, and thus it is possible to bring the light shielding film 169 into close to an alignment mark 301 and improve contrast at the time of alignment.

[Method of Manufacturing Imaging Element]

FIGS. 10A, 10B, 10C, 11A, and 11B are diagrams illustrating an example of a method of manufacturing an imaging element according to the third embodiment of the present disclosure. FIGS. 10A, 10B, 10C, 11A, and 11B are diagrams illustrating an example of a manufacturing process of the imaging element 1, and illustrate processes executed subsequently to the process of FIG. 6A.

Figure 10A:
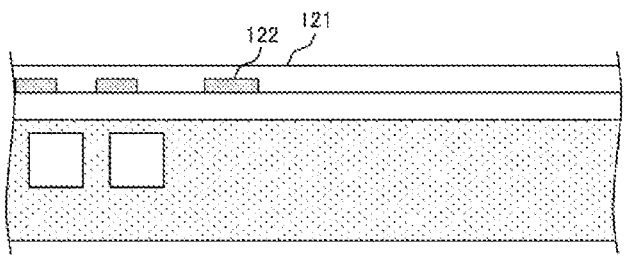
FIGS. 10A, 10B, and 10C are diagrams illustrating an example of a method of manufacturing the imaging element according to the third embodiment of the present disclosure.

In FIG. 10A, an interlayer insulating film 121 and a wiring layer 122 are laminated on the semiconductor substrate 110 of the imaging chip 10 (FIG. 10A).

Figure 10B:
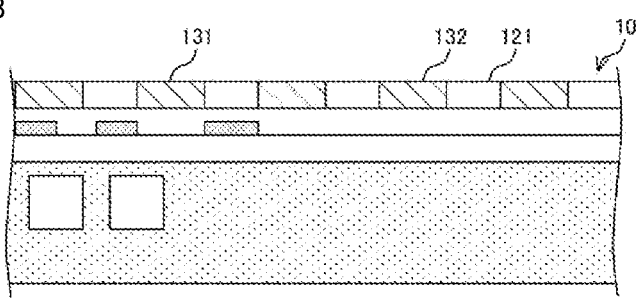
Figure 10C:
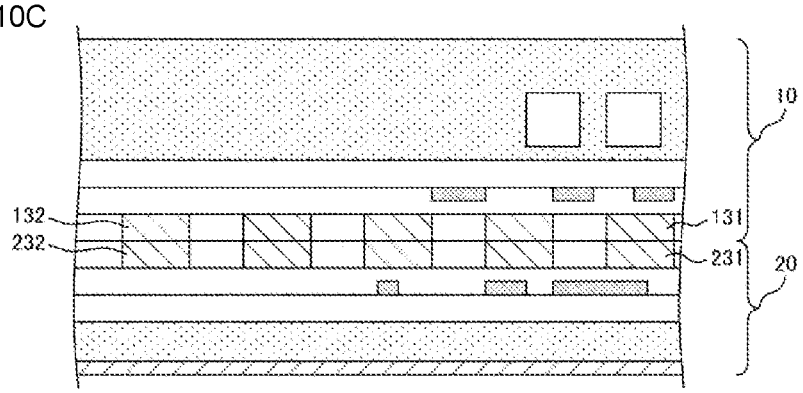

Next, pads 131 and 132 are formed in the interlayer insulating film 121 which is an outermost layer, and a wiring region 120 of the imaging chip 10 is formed (FIG. 10B). Next, the imaging chip 10 and an arithmetic chip 20 are bonded together (FIG. 10C).

Figure 11A:
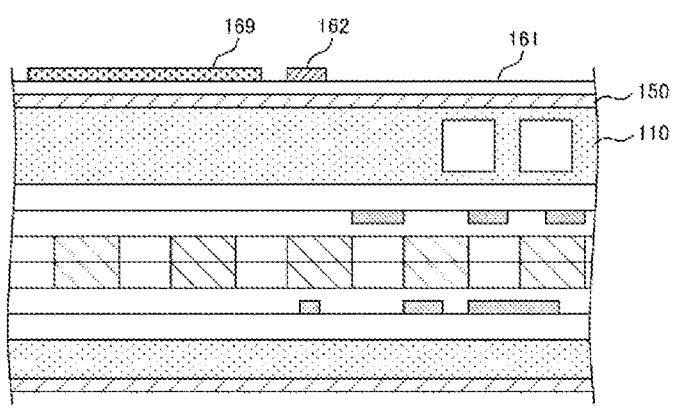
FIGS. 11A and 11B are diagrams illustrating an example of a method of manufacturing the imaging element according to the third embodiment of the present disclosure.

Next, the back surface side of the semiconductor substrate 110 of the imaging chip 10 is ground to be thinned, and the projection film 150 and the interlayer insulating film 161 are laminated. Next, the light shielding film 169 and the wiring layer 162 are disposed (FIG. 11A).

Figure 11B:
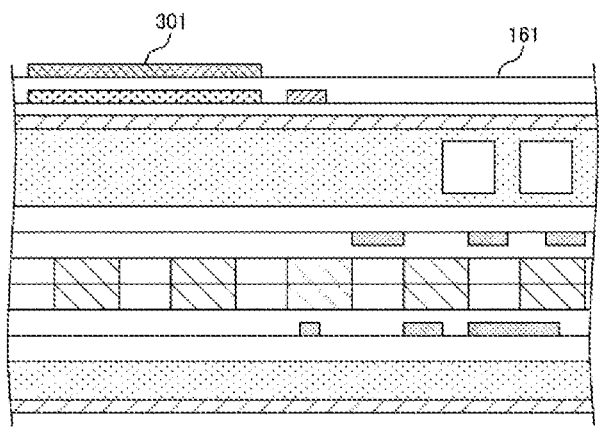

Next, the interlayer insulating film 161 is disposed, and the alignment mark 301 is formed (FIG. 11B). Thereafter, the imaging element 1 can be manufactured by disposing a projection film 171 and an on-chip lens 172 and performing dicing into individual pieces.

A configuration of the imaging element 1 other than the above-described configuration is the same as the configuration of the imaging element 1 described in the first embodiment of the present disclosure and thus description thereof will be omitted.

As described above, the imaging element 1 according to the third embodiment of the present disclosure can further improve the visibility of the alignment mark 301 by disposing the light shielding film 169 on the back surface side of the imaging chip 10.

4. Fourth Embodiment

In the imaging element 1 according to the above-described first embodiment, the alignment mark 301 and the light shielding film 129 are disposed in the imaging chip 10. On the other hand, an imaging element 1 according to a fourth embodiment of the present disclosure is different from that in the above-described first embodiment in that an alignment mark and a light shielding film are further disposed in an arithmetic chip 20.

[Cross-Sectional Configuration of Imaging Element]

Figure 12:
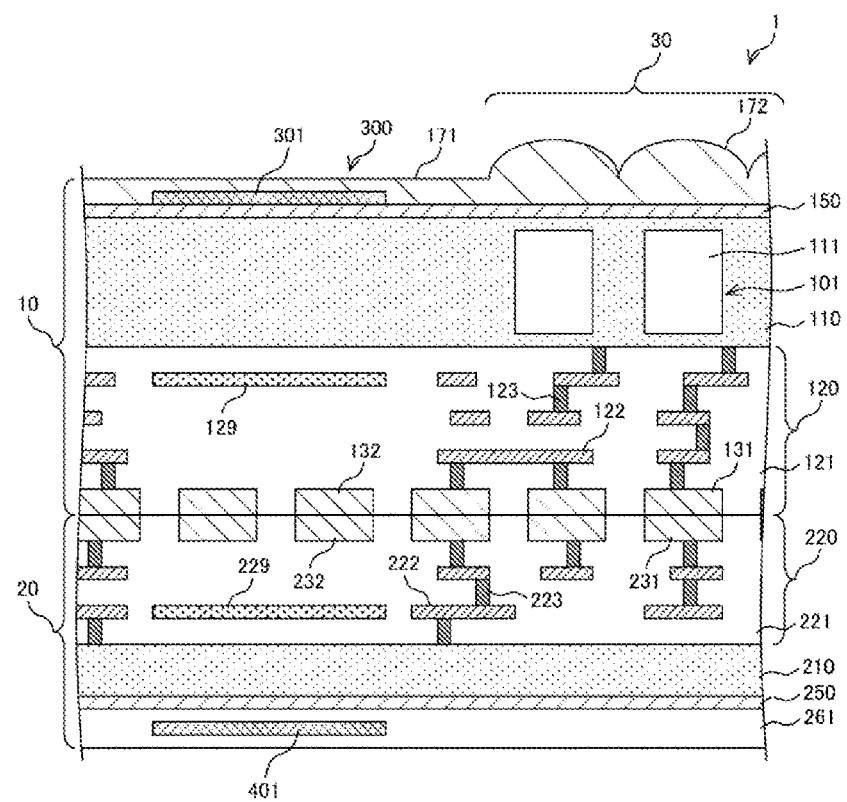
FIG. 12 is a cross-sectional view illustrating a configuration example of an imaging element according to a fourth embodiment of the present disclosure.

FIG. 12 is a cross-sectional view illustrating a configuration example of the imaging element according to the fourth embodiment of the present disclosure. The drawing is a cross-sectional view illustrating a configuration example of the imaging element 1, similar to FIG. 4. The imaging element is different from the imaging element 1 in FIG. 4 in that an alignment mark and a light shielding film of the arithmetic chip 20 are further disposed.

An alignment mark 401 is an alignment mark which is disposed on the back surface side of the arithmetic chip 20. The alignment mark 401 is disposed in an alignment mark region 300 and can be formed of the same material as that of the alignment mark 301. The alignment mark 401 can be disposed in an interlayer insulating film 261 which is disposed adjacent to a projection film 250 of the arithmetic chip 20.

A light shielding film 229 is a light shielding film which is disposed in the arithmetic chip 20. The light shielding film 229 is disposed between the alignment mark 401 and a pad 232 and shields light from the pad 232. The light shielding film 229 can be formed of a metal such as Cu, similar to the light shielding film 129. The light shielding film 229 in the drawing is disposed in a wiring region 220 and can be formed at the same time as a wiring layer 222. It is possible to improve the visibility of the alignment mark 401 disposed in the arithmetic chip 20 by disposing the light shielding film 229.

A configuration of the imaging element 1 other than the above-described configuration is the same as the configuration of the imaging element 1 described in the first embodiment of the present disclosure and thus description thereof will be omitted.

As described above, the imaging element 1 according to the fourth embodiment of the present disclosure can prevent a reduction in the visibility of the alignment mark 401 disposed in the arithmetic chip 20 by disposing the light shielding film 229 in the arithmetic chip 20. It is possible to dispose a plurality of alignment marks in the alignment mark region 300 and reduce the alignment mark region 300. It is possible to expand an effective region of a semiconductor chip.

5. Fifth Embodiment

In the imaging element 1 according to the above-described first embodiment, the alignment mark region 300 is disposed in the imaging chip 10. On the other hand, an imaging element 1 according to a fifth embodiment of the present disclosure is different from that in the above-described first embodiment in that an alignment mark region 300 is disposed outside an imaging chip 10.

[Configuration of Imaging Element]

Figure 13:
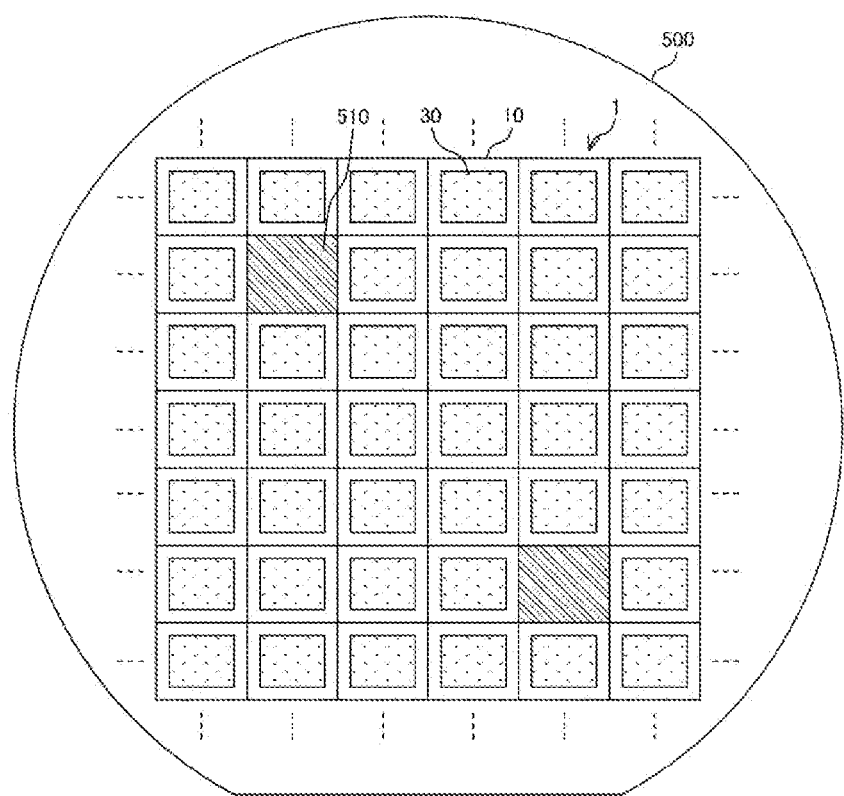
FIG. 13 is a diagram illustrating a configuration example of an imaging element according to a fifth embodiment of the present disclosure.

FIG. 13 is a diagram illustrating a configuration example of the imaging element according to the fifth embodiment of the present disclosure. The drawing is a diagram illustrating a configuration example of the imaging element 1, similar to FIG. 2. The imaging element is different from the imaging element 1 in FIG. 2 in that a configuration of the imaging element 1 before dicing into individual pieces is shown, and an alignment mark region 510 is disposed.

The imaging element 1 in the drawing shows a configuration before dicing into individual pieces is performed, and shows a configuration in a state where a wafer 500 having the imaging chip 10 disposed therein and a wafer 600 (not illustrated) having an arithmetic chip 20 disposed therein are bonded together. The drawing is a plan view illustrating a configuration of a light receiving surface of the imaging chip 10 in the wafer 500. As illustrated in the drawing, a plurality of imaging chips 10 are disposed in a lattice shape in the wafer 500. A pixel region 30 is disposed in each of the imaging chips 10.

The alignment mark region 510 is a region in which an alignment mark is disposed, similar to the alignment mark region 300. The alignment mark region 510 is disposed adjacent to the imaging chip 10 of the wafer 500. That is, the alignment mark region 510 is disposed instead of the imaging chip 10 in the wafer 500. The alignment mark disposed in the alignment mark region 510 is disposed outside the imaging chip 10, and is used for alignment in a manufacturing process of the imaging chip 10 in the vicinity of the alignment mark region 510. Also in the imaging element 1 in the drawing, the alignment mark region 510 is disposed in a region different from the pixel region 30. By disposing such an alignment mark region 510, it is possible to omit the alignment mark region 300 of each of the imaging chips 10 and expand the pixel region 30.

Note that a configuration of the alignment mark region 510 is not limited to this example. For example, the alignment mark region can also be disposed in a scribe region of the imaging chip 10. The scribe region is a region on which a dicing blade abuts, and is a region equivalent to the outermost circumference of the imaging chip 10 before dicing into individual pieces is performed. Also in this case, the alignment mark region 510 is disposed in a region different from the pixel region 30.

A configuration of the imaging element 1 other than the above-described configuration is the same as the configuration of the imaging element 1 described in the first embodiment of the present disclosure and thus description thereof will be omitted.

As described above, in the imaging element 1 according to the fifth embodiment of the present disclosure, the pixel region 30 can be expanded by disposing the alignment mark region 510 outside the imaging chip 10 or the like.

6. Sixth Embodiment

In the imaging element 1 according to the above-described first embodiment, the plurality of pixels 100 are disposed. In a sixth embodiment of the present disclosure, a circuit configuration of a pixel 100 will be described.

[Pixel Configuration]

Figure 14:
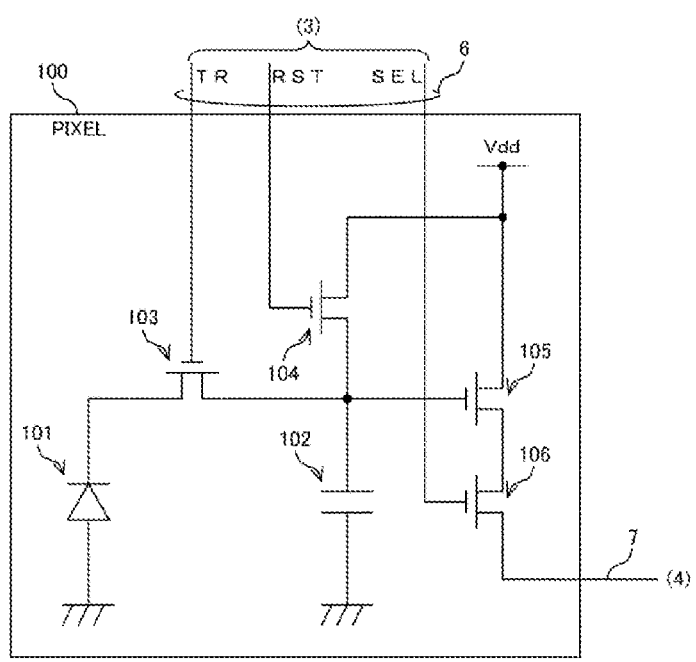
FIG. 14 is a diagram illustrating a configuration example of a pixel according to the embodiment of the present disclosure.

FIG. 14 is a diagram illustrating a configuration example of the pixel according to the embodiment of the present disclosure. The drawing is a circuit diagram illustrating a configuration example of the pixel 100. The pixel 100 in the drawing includes a photoelectric conversion unit 101, a charge holding unit 102, and MOS transistors 103 to 106.

An anode of the photoelectric conversion unit 101 is grounded, and a cathode thereof is connected to a source of the MOS transistor 103. A drain of the MOS transistor 103 is connected to a source of the MOS transistor 104, a gate of the MOS transistor 105, and an end of the charge holding unit 102. The other end of the charge holding unit 102 is grounded. Both the drains of the MOS transistors 104 and 105 are connected to a power supply line Vdd, and a source of the MOS transistor 105 is connected to a drain of the MOS transistor 106. A source of the MOS transistor 106 is connected to a signal line 7. Gates of the MOS transistors 103, 104, and 106 are respectively connected to a transfer signal line TR, a reset signal line RST, and a selection signal line SEL. Note that the transfer signal line TR, the reset signal line RST, and the selection signal line SEL constitute a signal line 6.

The photoelectric conversion unit 101 generates charge corresponding to emitted light as described above. The photo diode described in FIG. 4 can be used in the photoelectric conversion unit 101.

In addition, the charge holding unit 102 and the MOS transistors 103 to 106 constitute a pixel circuit. The MOS transistor 103 is a transistor that transfers charge generated by photoelectric conversion of the photoelectric conversion unit 101 to the charge holding unit 102. The transfer of charge in the MOS transistor 103 is controlled by a signal transmitted by the transfer signal line TR. The charge holding unit 102 is a capacitor that holds charge transferred by the MOS transistor 103. The MOS transistor 105 is a transistor that generates a signal based on charge held in the charge holding unit 102. The MOS transistor 106 is a transistor that outputs the signal generated by the MOS transistor 105 to the signal line 7 as an image signal. The MOS transistor 106 is controlled by a signal transmitted through the selection signal line SEL.

The MOS transistor 104 is a transistor that resets the charge holding unit 102 by discharging the charge held in the charge holding unit 102 to a power supply line Vdd. The reset performed by the MOS transistor 104 is controlled by a signal transmitted through the reset signal line RST, and is executed before the charge is transferred by the MOS transistor 103. Note that, at the time of the reset, it is also possible to reset the photoelectric conversion unit 101 by setting the MOS transistor 103 in an electrically conducting state. In this manner, the pixel circuit converts charge generated by the photoelectric conversion unit 101 into an image signal.

7. Example of Application to Camera

The technology according to the present disclosure (the present technology) can be applied to various products. For example, the present technology may be realized as an imaging element mounted on an imaging device such as a camera.

Figure 15:
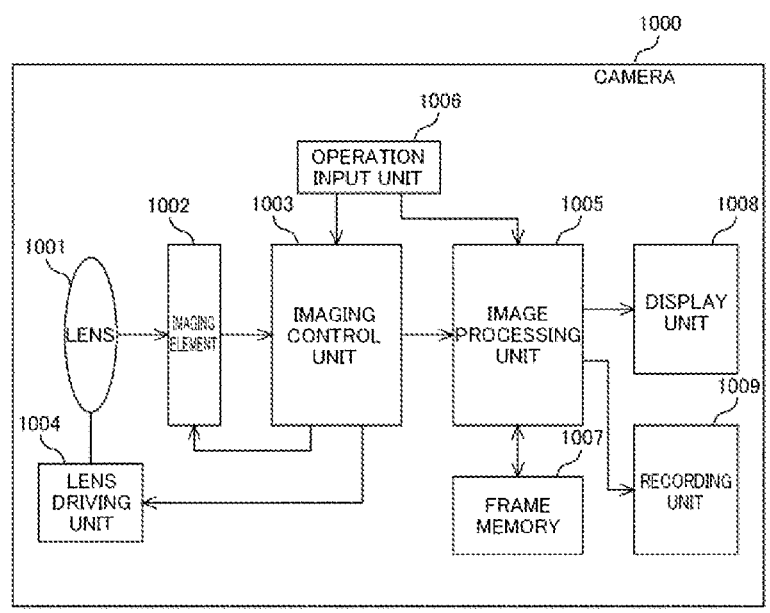
FIG. 15 is a block diagram illustrating a schematic configuration example of a camera which is an example of an imaging device to which the present technology can be applied.

FIG. 15 is a block diagram illustrating a schematic configuration example of a camera which is an example of an imaging device to which the present technology is applicable. A camera 1000 in the drawing includes a lens 1001, an imaging element 1002, an imaging control unit 1003, a lens driving unit 1004, an image processing unit 1005, an operation input unit 1006, a frame memory 1007, a display unit 1008, and a recording unit 1009.

The lens 1001 is an imaging lens of the camera 1000. The lens 1001 focuses light from a subject, causing the light to be incident on the imaging element 1002, which will be described later, and forms an image of the subject.

The imaging element 1002 is a semiconductor element that images the light from the subject focused by the lens 1001. The imaging element 1002 generates an analog image signal corresponding to emitted light, converts the analog image signal into a digital image signal, and outputs the digital image signal.

The imaging control unit 1003 controls imaging in the imaging element 1002. The imaging control unit 1003 controls the imaging element 1002 by generating a control signal and outputting the control signal to the imaging element 1002. In addition, the imaging control unit 1003 can perform auto-focus in the camera 1000 on the basis of an image signal output from the imaging element 1002. Here, the auto-focus is a system that detects a focal position of the lens 1001 and automatically adjusts the focal position. As the auto-focus, a method of detecting an image surface phase difference according to phase difference pixels disposed in the imaging element 1002 to detect a focal position (image surface phase difference auto-focus) can be used. In addition, a method of detecting a position at which the contrast of an image is maximized as a focal position (contrast auto-focus) can also be applied. The imaging control unit 1003 adjusts the position of the lens 1001 through the lens driving unit 1004 on the basis of the detected focal position and performs auto-focus. Meanwhile, the imaging control unit 1003 can be constituted by, for example, a Digital Signal Processor (DSP) provided with firmware.

The lens driving unit 1004 drives the lens 1001 on the basis of control by the imaging control unit 1003. The lens driving unit 1004 can drive the lens 1001 by changing the position of the lens 1001 using a built-in motor.

The image processing unit 1005 processes an image signal generated by the imaging element 1002. This processing corresponds to, for example, demosaicing for generating an image signal of an insufficient color among image signals corresponding to red, green, and blue for each pixel, noise reduction for removing noise in an image signal, image signal encoding, and the like. The image processing unit 1005 can be constituted by, for example, a microcomputer provided with firmware.

The operation input unit 1006 receives an operation input from a user of the camera 1000. For example, a pushbutton or a touch panel can be used as the operation input unit 1006. An operation input received by the operation input unit 1006 is transmitted to the imaging control unit 1003 and the image processing unit 1005. Thereafter, processing corresponding to the operation input, for example, processing such as imaging of a subject is started.

A frame memory 1007 is memory that stores a frame which is an image signal corresponding to one screen. The frame memory 1007 is controlled by the image processing unit 1005 and holds frames during image processing.

The display unit 1008 displays an image processed by the image processing unit 1005. For example, a liquid crystal panel can be used as the display unit 1008.

The recording unit 1009 records an image processed by the image processing unit 1005. For example, a memory card or a hard disk can be used as the recording unit 1009.

A camera to which the present disclosure can be applied has been described above. The present technique can be applied to the imaging element 1002 among the components described above. Specifically, the imaging element 1 illustrated in FIG. 1 can be applied to the imaging element 1002. By applying the imaging element 1 to the imaging element 1002, it is possible to prevent a reduction in the visibility of an alignment mark while preventing the generation of voids at the time of bonding. It is possible to reduce the manufacturing cost of the imaging element 1002. Note that the image processing unit 1005 is an example of a processing circuit recited in the claims. The camera 1000 is an example of an imaging device described in the claims.

Meanwhile, although the camera has been described as an example here, the technology according to the present disclosure may be applied to, for example, a monitoring device and the like in addition thereto. In addition, the present disclosure can also be applied to a semiconductor device in the form of a semiconductor module in addition to electronic apparatuses such as the camera. Specifically, the technology according to the present disclosure can also be applied to an imaging module that is a semiconductor module in which the imaging element 1002 and the imaging control unit 1003 of FIG. 15 are encapsulated in a single package.

Note that, the configuration of the second embodiment can be applied to other embodiments. Specifically, the alignment mark 302 in FIG. 2 may be combined with the imaging elements 1 in FIGS. 9 and 12.

The configuration of the third embodiment can be applied to other embodiments. Specifically, the light shielding film 169 in FIG. 9 can be disposed instead of the light shielding films 129 in FIGS. 8 and 12.

The configuration of the third embodiment can be applied to other embodiments. Specifically, the alignment mark 401 and the light shielding film 229 in FIG. 19 may be combined with the imaging elements 1 in FIGS. 8 and 9.

Note that the alignment mark 301 and the light shielding film 129 of the present disclosure can be applied to a semiconductor element other than the imaging element 1.

Finally, the descriptions of the above-described embodiments are merely examples of the present disclosure, and the present disclosure is not limited to the above-described embodiments. Therefore, it goes without saying that various changes aside from the above-described embodiments can be made according to the design and the like within a scope that does not depart from the technical spirit of the present disclosure.

Additionally, the effects described in the present specification are merely examples, and are not limiting. Other effects may be obtained as well.

In addition, the drawings in the above-described embodiments are schematic, and dimensional ratios and the like of respective parts are not necessarily consistent with actual ones. In addition, the drawings of course include parts where dimensional relationships and ratios differ from drawing to drawing.

The present technique can also have the following configurations.

(1) An imaging element including:
a semiconductor substrate that includes a pixel region which is a region in which pixels for generating an image signal in accordance with incident light are disposed;
a pad that is disposed on a surface side of the semiconductor substrate; an alignment mark that is disposed on a back surface side of the semiconductor substrate; and
a light shielding film that is disposed between the pad and the alignment mark.

(2) The imaging element according to (1), wherein the light shielding film is disposed on the surface side of the semiconductor substrate.

(3) The imaging element according to (1), wherein the light shielding film is disposed on the back surface side of the semiconductor substrate.

(4) The imaging element according to any one of (1) to (3), further including a second alignment mark disposed between the pad and the light shielding film.

(5) The imaging element according to any one of (1) to (4), wherein the alignment mark is disposed in a region different from the pixel region.

(6) The imaging element according to (5), wherein the alignment mark is disposed adjacent to the pixel region.

(7) The imaging element according to any one of (1) to (6), wherein the semiconductor substrate is a semiconductor chip.

(8) The imaging element according to (7), wherein the alignment mark is disposed at a peripheral edge portion of the semiconductor chip.

(9) The imaging element according to (7), wherein the alignment mark is disposed outside the semiconductor chip.

(10) The imaging element according to any one of (1) to (9), wherein the light shielding film is formed of a metal.

(11) The imaging element according to any one of (1) to (10), wherein the semiconductor substrate further includes a wiring region having a wiring disposed on the surface side and connected to the pixels,
the pad is disposed on a surface of the wiring region, and
the light shielding film is disposed in the same layer as the wiring.

(12) The imaging element according to any one of (1) to (11), further including a second semiconductor substrate that includes a second pad,
wherein the pad is joined to the second pad.

(13) The imaging element according to (12), wherein a processing circuit processing the generated image signal is disposed in the second semiconductor substrate.

(14) An imaging device including:
an imaging element including a semiconductor substrate that includes a pixel region which is a region in which pixels for generating an image signal in accordance with incident light are disposed,
a pad that is disposed on a surface side of the semiconductor substrate,
an alignment mark that is disposed on a back surface side of the semiconductor substrate, and
a light shielding film that is disposed between the pad and the alignment mark; and
a processing circuit that processes the generated image signal.

REFERENCE SIGNS LIST

1 Imaging element
2 Pixel array portion
4 Column signal processing unit
10 Imaging chip
20 Arithmetic chip
30 Pixel region
100 Pixel
101 Photoelectric conversion unit
110, 210 Semiconductor substrate
120, 220 Wiring region
121, 161, 221, 261 Interlayer insulating film 122, 162, 222 Wiring layer
129, 169, 229 Light shielding film
131, 132, 231, 232 Pad
300, 510 Alignment mark region
301, 302, 401 Alignment mark
500 Wafer
1000 Camera
1002 Imaging element
1005 Image processing unit

The invention claimed is:

1. An imaging element, comprising:
a first semiconductor substrate that includes a pixel region, wherein
the pixel region includes a plurality of pixels, and
the plurality of pixels is configured to generate image signals based on incident light;
a first pad on a front surface side of the first semiconductor substrate;
a first alignment mark on a back surface side of the first semiconductor substrate;
a light shielding film between the first pad and the first alignment mark; and
a second alignment mark below the first alignment mark, wherein the second alignment mark is between the first pad and the light shielding film.

2. The imaging element according to claim 1, wherein the light shielding film is on the front surface side of the first semiconductor substrate.

3. The imaging element according to claim 1, wherein the first alignment mark is in a specific region different from the pixel region.

4. The imaging element according to claim 3, wherein the specific region is adjacent to the pixel region.

5. The imaging element according to claim 1, wherein the first semiconductor substrate is a semiconductor chip.

6. The imaging element according to claim 5, wherein the first alignment mark is at a peripheral edge portion of the semiconductor chip.

7. The imaging element according to claim 5, wherein the first alignment mark is outside the semiconductor chip.

8. The imaging element according to claim 1, wherein the light shielding film comprises a metal.

9. The imaging element according to claim 1, wherein
the first semiconductor substrate further includes a wiring region having a wiring,
the wiring is on the front surface side of the first semiconductor substrate,
the wiring is connected to the plurality of pixels,
the first pad is on a surface of the wiring region, and
the light shielding film is in the same layer as the wiring.

10. The imaging element according to claim 1, further comprising a second semiconductor substrate that includes a second pad, wherein the first pad is in contact with the second pad.

11. The imaging element according to claim 10, further comprising a processing circuit in the second semiconductor substrate, wherein
the processing circuit is configured to process the generated image signals.

12. An imaging device, comprising:
an imaging element including:
a semiconductor substrate, wherein
the semiconductor substrate includes a pixel region,
the pixel region includes a plurality of pixels, and
the plurality of pixels is configured to generate image signals based on incident light;
a pad on a front surface side of the semiconductor substrate;
a first alignment mark on a back surface side of the semiconductor substrate;
a light shielding film between the pad and the first alignment mark; and
a second alignment mark below the first alignment mark, wherein the second alignment mark is between the pad and the light shielding film; and
a processing circuit configured to process the generated image signals.

* * * * *